United States Patent
Jain et al.

[19]

[11] Patent Number: 5,852,771
[45] Date of Patent: Dec. 22, 1998

[54] MIXER WITH TWO DIODES INCLUDING DC COUPLED IF

[75] Inventors: Nitin Jain, Nashua, N.H.; Scott B. Doyle, Sudbury, Mass.

[73] Assignee: The Whitaker Corporation, Wilmington, Del.

[21] Appl. No.: 663,762

[22] Filed: Jun. 14, 1996

[51] Int. Cl.⁶ .................................................. H04B 1/26
[52] U.S. Cl. .......................................... 455/330; 455/327
[58] Field of Search .......................... 455/330, 325–327, 455/333; 343/700 MS

[56] References Cited

U.S. PATENT DOCUMENTS

| | | | |
|---|---|---|---|
| 3,952,262 | 4/1976 | Jamison | 331/55 |
| 4,348,773 | 9/1982 | Caroli | 455/326 |
| 4,435,848 | 3/1984 | Sedlmair | 455/327 |
| 4,651,344 | 3/1987 | Hasegawa et al. | 455/330 X |
| 4,658,440 | 4/1987 | Pavio et al. | 455/324 |
| 4,827,270 | 5/1989 | Udagawa et al. | 343/853 |
| 4,845,389 | 7/1989 | Pyndiah et al. | 327/113 |
| 4,931,799 | 6/1990 | Wen et al. | 455/326 X |
| 4,955,079 | 9/1990 | Connerney et al. | 455/325 |
| 4,996,533 | 2/1991 | May et al. | 342/108 |
| 5,175,880 | 12/1992 | Brown | 455/226.1 |
| 5,325,000 | 6/1994 | Birkeland et al. | 455/313 |

FOREIGN PATENT DOCUMENTS

| 35412 | 4/1978 | Japan | 455/330 |
|---|---|---|---|

*Primary Examiner*—Thomas J. Mullen, Jr.
*Attorney, Agent, or Firm*—Gerald K. Kita

[57] ABSTRACT

A mixer (1) comprising, an RF port 2 and an LO port (3) supplying two diodes (7), a junction (8) of the diodes (7) referenced to ground (9), and a differential amplifier (19) being supplied with +IF and –IF from outputs of the diodes (7), and the differential amplifier (19) supplying low LO AM noise and low frequency response of an IF port (18) at an output (20) of the differential amplifier.

11 Claims, 2 Drawing Sheets

MIXER WITH TWO DIODES INCLUDING DC COUPLED IF

FIELD OF THE INVENTION

The invention relates to a mixer, and more particularly, to a baseband mm-wave mixer with LO AM noise rejection.

BACKGROUND OF THE INVENTION

U.S. Pat. No. 4,435,848 describes a typical prior mixer comprising, an RF port connected to two diodes of opposite polarity that supply RF voltages of opposite phase to the mixer having a single output IF port for IF voltage of intermediate frequency. The prior mixer is fabricated of stripline construction, which replaces a number of discrete circuit components. Stripline construction advantageously replaces discrete components that require separate testing for reliability, followed by individual assembly in an electrical circuit to construct the mixer. A stripline construction provides a mixer with the advantages of, smaller size, ease of manufacture and greater reliability of operation, as compared with a mixer constructed of discrete circuit components. In a typical prior mixer, a blocking capacitor between the mixer diodes and the IF port is required to block DC voltage and provide LO AM noise reduction, the LO referring to LO voltage supplied by a local oscillator. Such a blocking capacitor is described by the patent as being a discrete circuit element located at the junction terminal of the two diodes.

One of the problems associated with the blocking capacitor is its spatial size. As shown in the drawings of the patent, the blocking capacitor must fit in a space between two microstrip lines that are used for impedance matching. A discrete circuit component has a small size that will fit in the space. However, the discrete circuit component has all the disadvantages, described above, that the stripline construction is intended to replace. Although the blocking capacitor can be manufactured with a planar microstrip construction using integrated circuit, GMIC, fabrication techniques, such a construction is large in planar spatial area, which makes it impractical for being fitted on an integrated circuit together with the remainder of the mixer. For example, for a mm-wave mixer, at 10 Hz IF to 100 Hz IF, the blocking capacitor needs to be on the order of microFarad capacitance, which is of a size that is impractical for fabrication on the same integrated circuit, GMIC, as the remainder of the mixer.

Another disadvantage associated with a blocking capacitor at the IF port resides in low frequency blocking. In a low Doppler shift homodyne system, low frequency blocking is undesired. The presence of a DC blocking capacitor at the IF port would provide an undesired limitation on low frequency response of the mixer. However, a need remains to provide a mixer with low LO AM noise, as well as good response at low frequency.

SUMMARY OF THE INVENTION

An advantage of the invention resides in a mixer comprised of an RF port and an LO port supplying two diodes, and a differential amplifier being supplied with +IF and −IF from outputs of the diodes, and the differential amplifier supplying low LO AM noise and low frequency response to an IF port at an output of the differential amplifier.

Another advantage of the invention resides in a mixer comprising: an RF port and an LO port supplying two diodes of the same polarity, a junction of the diodes referenced to ground, and +IF and −IF extracted by diplexers at junctions of the RF and LO ports with terminals of the diodes.

Another advantage of the invention resides in excellent noise reduction, which results from at least one of bias resistors of the two diodes being variable, and the differential amplifier being self compensating for differences in output voltages of the diodes, to result in low AM noise.

According to an embodiment of the invention, the two diodes are of the same polarity, with a junction of the diodes referenced to ground, and anode or cathode electrodes of the diodes being supplied with a source of DC bias voltage, and resonators at respective junctions of the gates and the RF and LO ports.

A further embodiment of the invention resides in a mixer comprised of RF and LO ports connected with two diodes referenced to a source of anode biasing voltage, and a junction of the diodes referenced to ground, and RF shorting resonators at the anodes of the diodes, to extract +IF and −IF, and a differential amplifier connected between an IF port and the +IF and −IF resonators, the differential amplifier supplying low LO AM noise and low frequency response.

According to a further embodiment of the invention, a mixer comprises, RF and LO ports connected to two diodes that supply IF to an IF port, the diodes being of the same polarity and referenced to a source of bias voltage at respective anodes of the diodes, RF shorting resonators at the anodes of the diodes, +IF and −IF ports at the junctions of the resonators and the anodes, and a differential amplifier connected between the IF port and the +IF and −IF ports, and LO AM noise reduction being provided by the differential amplifier supplying IF to the IF port.

DESCRIPTION OF THE DRAWINGS

Embodiments of the invention will now be described, by way of example, with reference to the accompanying drawings, according to which.

DETAILED DESCRIPTION

Figure 1:
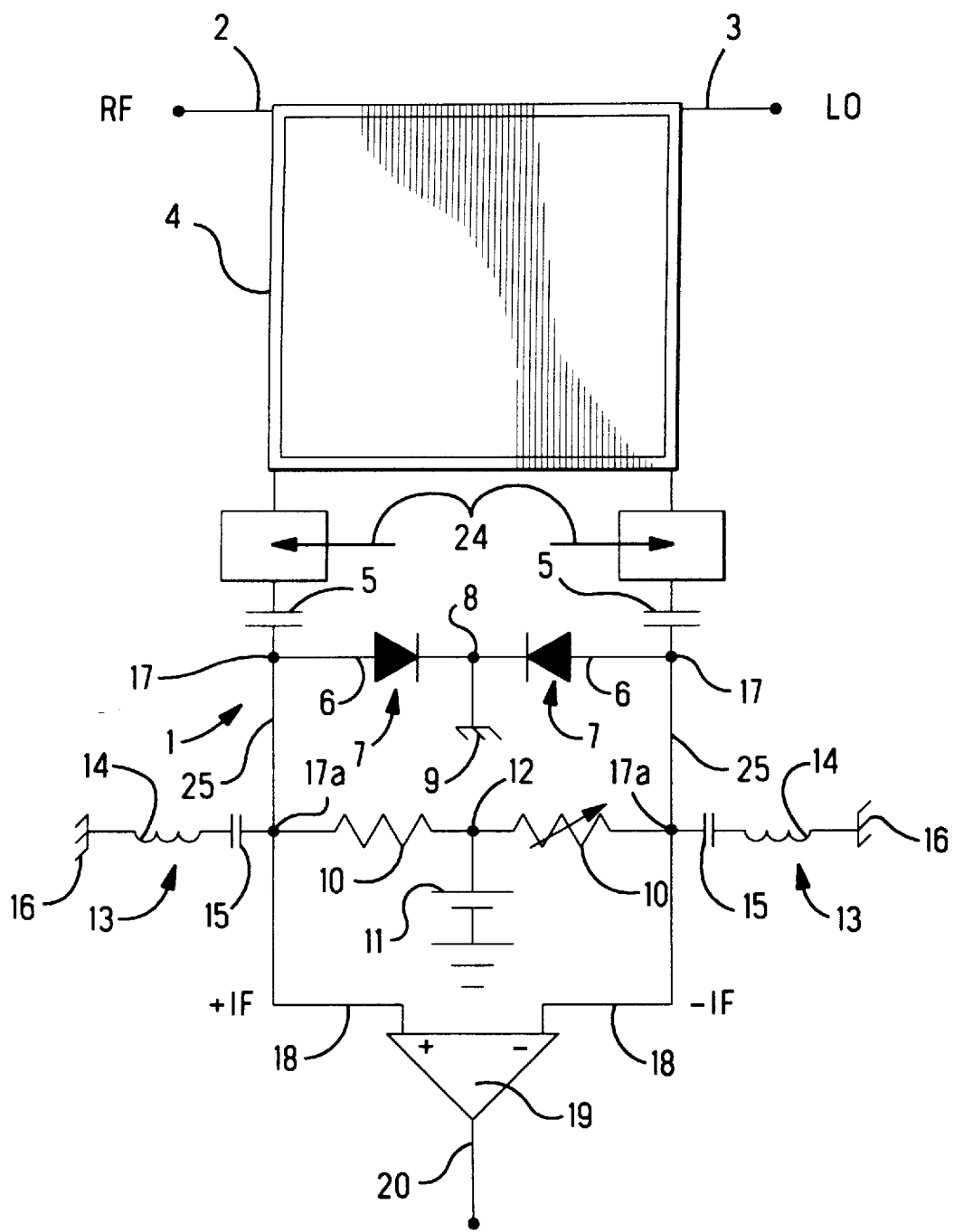
FIG. 1 is a schematic view of a mixer with diodes of the same polarity.

With reference to the Figs., a mixer 1 comprises an RF port 2 and an LO port 3 connected by a branch line hybrid circuit 4 fabricated of GMIC techniques to blocking capacitors 5 at respective anodes 6, also known as anode electrodes, of two diodes 7. The blocking capacitors 5 are in the range of about 5 pf capacitance, and consequently can be fabricated by GMIC techniques with a reasonably small spatial area. The diodes 7 are of the same polarity, with their junction 8 referenced to ground 9, or earth. Anodes 6 of the diodes 7 are connected to respective termination and bias resistors 10. The anodes 6 of the diodes 7 are biased by a source 11 of DC voltage, Vce, referenced to ground at 9 and connected to a junction 12 of the two termination and bias resistors 10.

Figure 2:
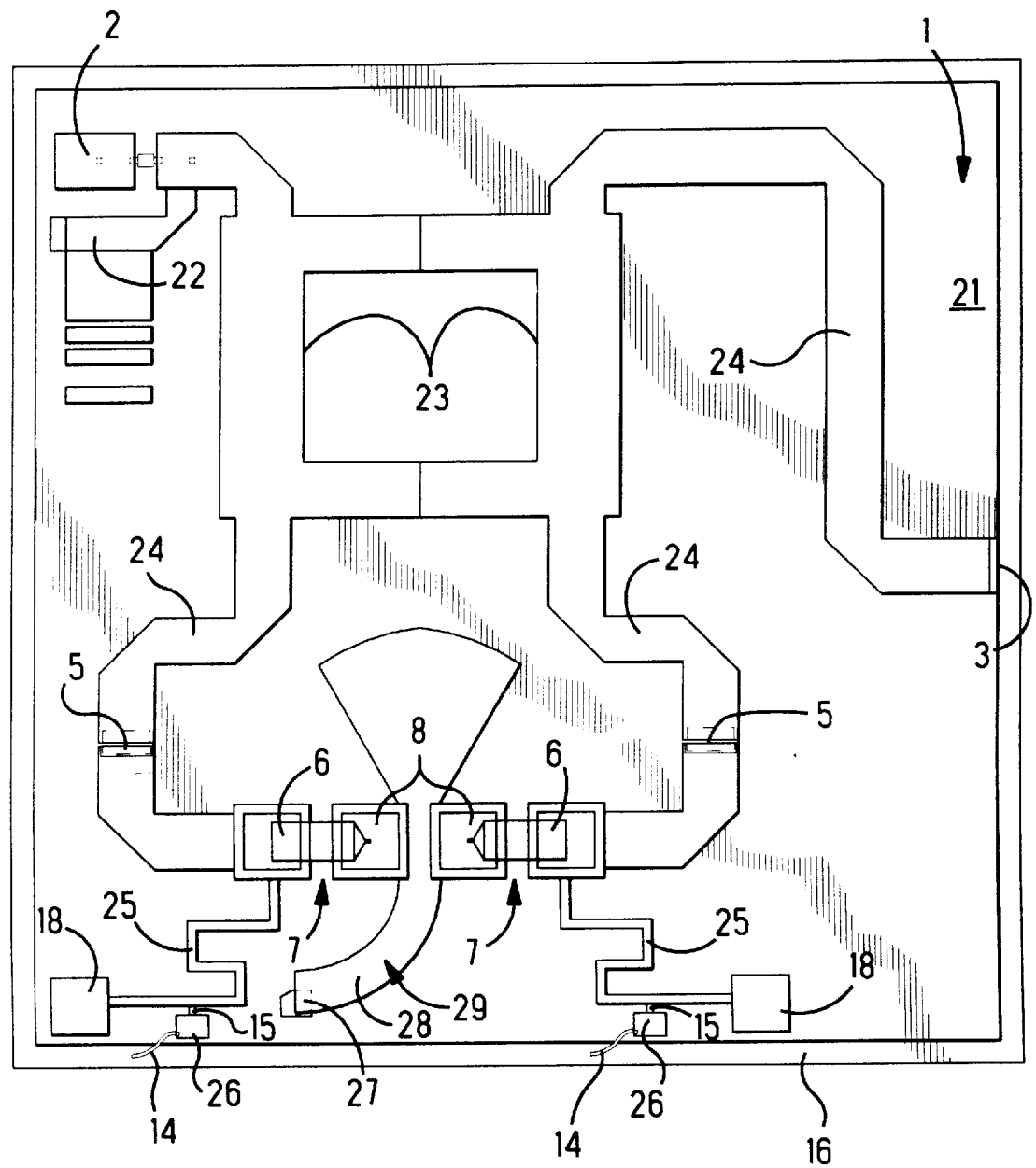
FIG. 2 is a GMIC circuit of the mixer as depicted in FIG. 1.

Each of two RF shorting resonators 13 comprises, a series connected inductor in the form of a bond wire 14 and capacitor 15 referenced to ground 16. In FIG. 2, the ground 16 is a conducting boundary encircling the remainder of the circuitry 1. The resonators 13 are at respective junctions 17a of the anodes 6, and are about one quarter wavelength apart from the junction 17 of the anodes 6 with an RF port 2 and an LO port 3. At high RF frequencies the resonators 13 serve as electrical shorts of the RF frequencies through the respective capacitors 15. At low frequencies, the resonators 13 serve as open circuits. The resonators 13 comprise diplexers to extract +IF and −IF, voltages, respectively. The +IF and −IF are supplied over respective IF ports 18 to a differential amplifier 19.

To avoid DC blocking, and accompanying low frequency blocking, and to assure response at low frequency with low LO AM noise, the differential amplifier 19 is supplied with +IF and −IF extracted by the RF shorting resonators 13. Respective inductors 14 of the resonators 13 connect with respective IF input ports 18 of the differential amplifier 19. The differential amplifier 19 provides an IF output port 20, at an output of the differential amplifier 19, an output IF with LO AM noise reduction, and without DC blocking and without accompanying, low frequency blocking. The mixer 1 is suitable for a mm-wave mixer, at close to DC IF to 100 Hz IF operation.

With reference to FIG. 2, the mixer 1 is in the form of a microstrip construction on a planar substrate 21, with the RF port 2 of microstrip construction being supplied with RF voltages over a resonator 22 of microstrip construction, and the LO port 3 of microstrip construction being supplied with LO voltages. The RF port 2 and the LO port 3 are integral parts of a stripline construction comprising, a four port, branch line hybrid ring 23, with impedance matching circuitry, and with the DC and IF blocking capacitors 5 interposed in the microstrip line segments 24 of the mixer 1 that extend to the anodes 6 of the diodes 7, comprised of surface mount silicon diodes. Substantially narrow microstrip lines are matching lines 25 that provide a one quarter wavelength phase difference between the junctions 17 and 17a. The lines 25 extend to a conductive +IF port 18 and a conductive −IF port 18, respectively, of microstrip construction. Each ground line 25 connects to a conductive pad terminal 26. The bond wire 14 joins the pad terminal 26 with the ground 16. The junction 8 of the diodes 7 is connected to ground, or earth, at a conductive ground terminal 27 formed by a curved, guided end 28 of a conductive planar patch 29 that opens out at an opposite end 30 from the curved end 28. Another bond wire, not shown, connects the terminal 27 to ground 16.

The bias resistors 10 can be individually varied and controlled, by at least one of the bias resistors 10 being variable as shown by an arrow, to compensate for the voltage outputs of the diodes 7 being unequal due to individual variances in the diodes 7 themselves. Excellent noise reduction is thereby attained. Alternatively, the amplifier 19 can be self-compensating for the difference in voltages from the diodes 7 due to noise, to provide balanced input voltages to the amplifier 19, and attain desired low AM noise.

An advantage of the invention resides in a mixer comprised of an RF port and an LO port supplying two diodes, and a differential amplifier being supplied with +IF and −IF from outputs of the diodes, and the differential amplifier supplying low LO AM noise and low frequency response to an IF port at an output of the differential amplifier.

Another advantage of the invention resides in a mixer comprising: an RF port and an LO port supplying two diodes of the same polarity, a junction of the diodes referenced to ground, and +IF and −IF extracted by diplexers at junctions of the RF and LO ports with gates of the diodes.

Other embodiments and modifications are intended to be covered by the spirit and scope of the appended claims.

What is claimed is:

1. A mixer comprising: an RF port and an LO port supplying two diodes, a junction of the diodes referenced to ground, and a differential amplifier being supplied with +IF and −IF from outputs of the diodes, and the differential amplifier supplying low LO AM noise and low frequency response of an IF port at an output of the differential amplifier.

2. A mixer as recited in claim 1, wherein the diodes are of the same polarity.

3. A mixer as recited in claim 1, wherein the amplifier is supplied with +IF and −IF extracted by RF shorting resonators at junctions of the RF and LO ports with the diodes.

4. A mixer as recited in claim 1, and further comprising: termination resistors supplying diode bias voltage at the terminals of the diodes, and the termination resistors being referenced to a source of DC voltage.

5. A mixer as recited in claim 1, and further comprising: a blocking capacitor between the diodes and the respective RF and LO ports.

6. A mixer as recited in claim 3, wherein, each of the RF shorting resonators comprises, a series connected capacitor and an inductor referenced to ground.

7. A mixer comprising: an RF port and an LO port supplying two diodes of the same polarity, a junction of the diodes referenced to ground, and +IF and −IF extracted by diplexers at junctions of the RF and LO ports with the diodes.

8. A mixer as recited in claim 7, and further comprising: a differential amplifier being supplied with +IF and −IF from outputs of the diodes, and the differential amplifier supplying low LO AM noise and low frequency response of an IF port at an output of the differential amplifier.

9. A mixer as recited in claim 7, wherein a differential amplifier is supplied with +IF and −IF extracted by said diplexers.

10. A mixer as recited in claim 7, and further comprising: termination resistors supplying diode bias voltage at the terminals of the diodes, and the termination resistors being referenced to a source of DC voltage.

11. A mixer as recited in claim 7, and further comprising: a blocking capacitor between the diodes and the respective RF and LO ports.

* * * * *